(12) United States Patent
Ardehali

(10) Patent No.: US 8,970,311 B2
(45) Date of Patent: Mar. 3, 2015

(54) VOLTAGE-CONTROLLED OSCILLATOR WITH AMPLITUDE AND FREQUENCY INDEPENDENT OF PROCESS VARIATIONS AND TEMPERATURE

(76) Inventor: Mohammad Ardehali, Palo Alto, CA (US)

( * ) Notice: Subject to any disclaimer, the term of this patent is extended or adjusted under 35 U.S.C. 154(b) by 30 days.

(21) Appl. No.: 13/406,228

(22) Filed: Feb. 27, 2012

(65) Prior Publication Data

US 2013/0222066 A1 Aug. 29, 2013

(51) Int. Cl.
*H03K 3/03* (2006.01)

(52) U.S. Cl.
USPC .......... 331/57; 331/177 R; 331/182; 331/185; 331/186

(58) Field of Classification Search
USPC .................... 331/57, 175, 182, 183, 185, 186
See application file for complete search history.

(56) References Cited

U.S. PATENT DOCUMENTS

| | | | |
|---|---|---|---|
| 6,462,623 B1 * | 10/2002 | Horan et al. | ..................... 331/17 |
| 7,639,093 B2 | 12/2009 | Ardehali | |
| 7,760,018 B2 | 7/2010 | Ardehali | |
| 7,760,032 B2 | 7/2010 | Ardehali | |
| 7,782,111 B2 | 8/2010 | Ardehali | |
| 7,969,253 B2 * | 6/2011 | Shiah et al. | ................... 331/185 |

* cited by examiner

*Primary Examiner* — Joseph Chang
*Assistant Examiner* — Jeffrey Shin
(74) *Attorney, Agent, or Firm* — TIPS Group

(57) ABSTRACT

In one embodiment, a voltage-controlled oscillator (VCO) is provided having an output signal having a frequency responsive to a tuning signal. The VCO includes: a plurality of inverters coupled to form a loop, each differential inverter having a differential pair of transistors configured to steer a tail current from a current source, the current source sourcing the tail current responsive to a bias voltage, each inverter stage including a plurality of switched-capacitor circuits configured to control a signal delay through the inverter stage response to the tuning signal so as to control the frequency of the output signal; and a bias circuit configured to generate the bias voltage responsive to a reference signal such that an amplitude of the output signal is substantially independent of the output signal frequency and depends upon the reference signal.

20 Claims, 5 Drawing Sheets

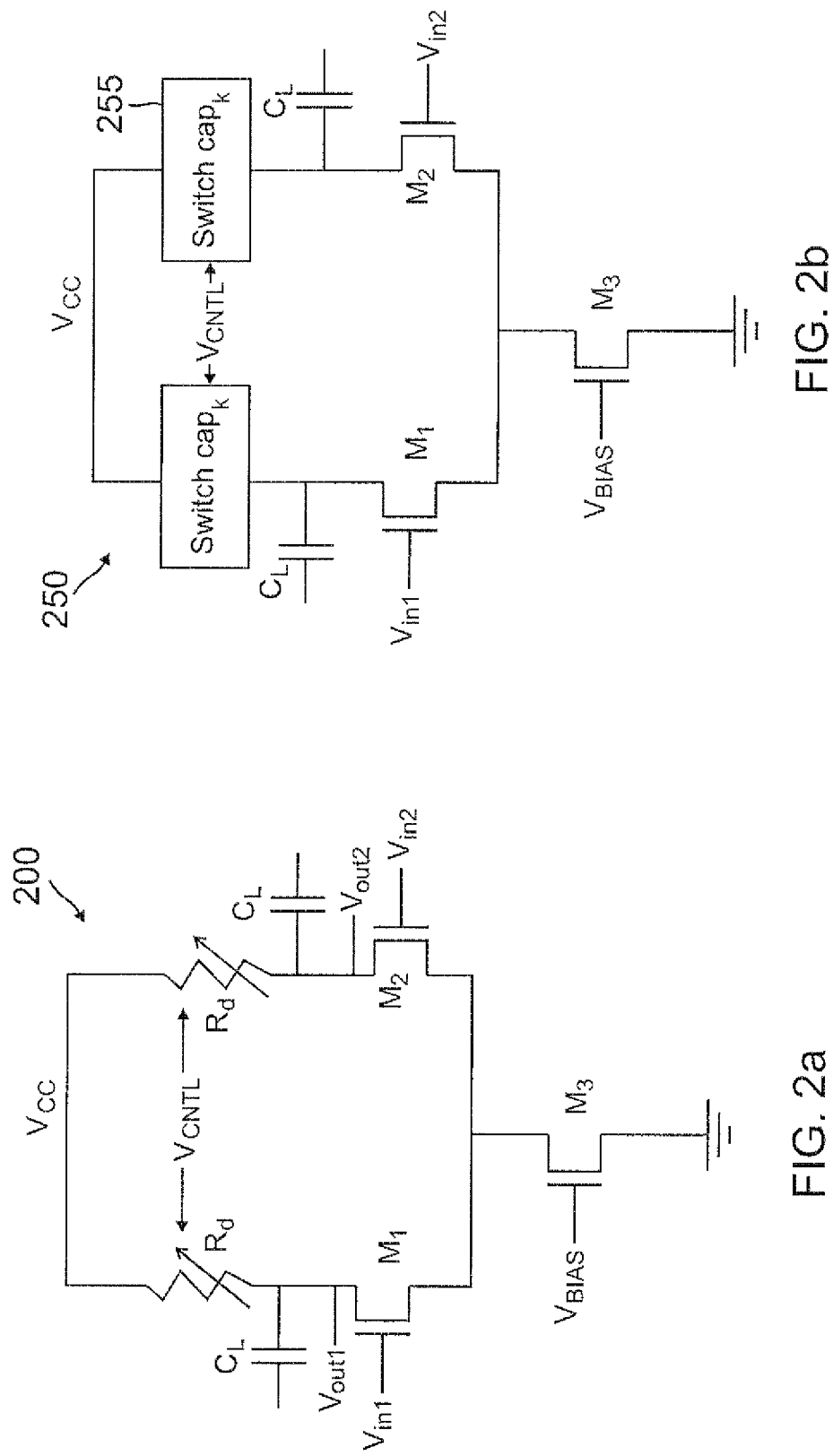

VOLTAGE-CONTROLLED OSCILLATOR WITH AMPLITUDE AND FREQUENCY INDEPENDENT OF PROCESS VARIATIONS AND TEMPERATURE

TECHNICAL FIELD

The present invention relates generally to voltage controlled oscillators and more particularly to a voltage controlled oscillator having an amplitude and frequency that is independent of process variations and temperature.

BACKGROUND

Voltage controlled oscillators (VCOs) are an important and integral part of many electronics systems. VCO applications include carrier synthesis in cellular phones, phase locked loops in microprocessors and communication systems, and clock generations for optical communications. Although VCOs have been used in numerous electronic systems for more than a hundred years, none of the known architectures satisfy all of the following requirements: (i) providing a frequency of oscillation that is independent of semiconductor process corners, (ii) providing a frequency of oscillation that is independent of temperature, (iii) providing an amplitude of oscillation that is independent of semiconductor process corners, (iv) providing an amplitude of oscillation that is independent of temperature, and (v) providing an amplitude of oscillation that is independent of tuning or oscillation frequency. Because these requirements have not been met, the VCO amplitude and frequency varies in an undesirable fashion.

Accordingly, there is a need in the art for improved architectures.

SUMMARY

In one embodiment, a voltage-controlled oscillator (VCO) is provided having an output signal having a frequency responsive to a tuning signal. The VCO includes: a plurality of inverters coupled to form a loop, each differential inverter having a differential pair of transistors configured to steer a tail current from a current source, the current source sourcing the tail current responsive to a bias voltage, each inverter stage including a plurality of switched-capacitor circuits configured to control a signal delay through the inverter stage response to the tuning signal so as to control the frequency of the output signal; and a bias circuit configured to generate the bias voltage responsive to a reference signal such that an amplitude of the output signal is substantially independent of the output signal frequency and depends upon the reference signal.

In another embodiment, a phase-locked-loop (PLL) is provided that includes: a phase detector configured to compare the phase between a divided signal and an input signal to provide a phase detector output signal; a loop filter configured to filter the phase detector output signal to provide a tuning signal; and a voltage-controlled oscillator (VCO) including a plurality of inverters coupled to form a loop, each differential inverter having a differential pair of transistors configured to steer a tail current from a current source transistor, the current source transistor sourcing the tail current responsive to a bias voltage, each inverter stage including a plurality of switched-capacitor circuits configured to control a signal delay through the inverter stage response to the tuning signal so as to control the frequency of the output signal; and a bias circuit configured to generate the bias voltage responsive to a reference signal such that an amplitude of an output signal for the PLL is substantially independent of its output signal frequency and depends upon the reference signal.

The invention will be more fully understood upon consideration of the following detailed description, taken together with the accompanying drawings.

BRIEF DESCRIPTION OF THE DRAWINGS

FIG. 1b shows a switched-capacitor circuit having an equivalent resistance to the resistor of FIG. 1a.

FIG. 2a is a schematic illustration of a conventional inverter stage.

FIG. 2b is a schematic illustration of an inverter stage having an output frequency independent of temperature and process corner variations.

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

To meet the five requirements discussed above, a VCO is provided with a biasing circuit and switched-capacitor circuits. The switched-capacitor circuits are discussed first as follows.

Switched-Capacitor Circuits

FIG. 1 (a) shows a resistor having a resistance R connected between two nodes A and B. Under Ohm's law, if the voltage of node A is $V_A$ and the voltage of node B is $V_B$, the role of the resistor is to transfer $(V_A-V_B)/R$ amps of charge every second from node A to node B. But the same function can also be performed by a switched-capacitor circuit including a capacitor $C_{clk}$ as shown in FIG. 1b. Switches $S_1$ and $S_2$ are driven open and closed in a non-overlapping fashion according to a switching frequency $f_{clk}$. Thus, when switch $S_1$ is closed, switch $S_2$ is open. Conversely, when switch $S_2$ is closed, switch $S_1$ is open. Suppose the same voltages exist for nodes A and B as discussed for FIG. 1a. The charge moved from node A to node B in one cycle of the switching frequency $f_{clk}$ is equal to the average current I flowing between the two nodes, i.e., $I = f_{clk} C_{clk} (V_A - V_B)$ or $$R = \frac{1}{f_{clk} C_{clk}}.$$

Therefore, a switched-capacitor circuit may be viewed as a resistor whose value is equal to $$\frac{1}{f_{clk} C_{clk}}.$$

This equivalence of capacitors and resistors, which was first discovered by Maxwell, is the foundation of switched-capacitor circuits.

Figure 1A:
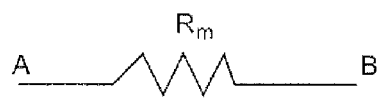
FIG. 1a shows a conventional resistor.
Figure 1B:
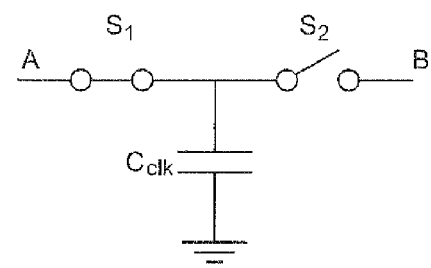
Figure 1C:
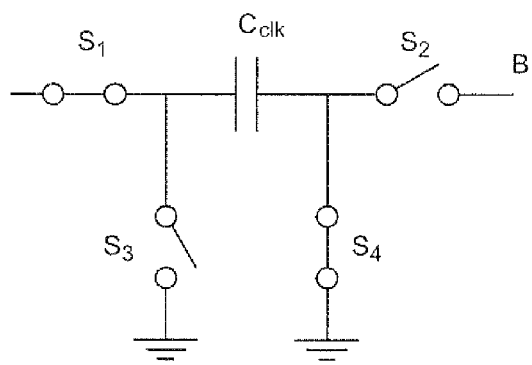
FIG. 1c shows a parasitic-insensitive variation for the switched-capacitor circuit of FIG. 1b.
Figure 1D:
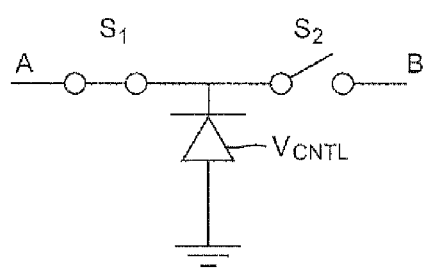
FIG. 1d shows a switched-capacitor circuit having a varactor providing a variable capacitance responsive to a control voltage.

The equivalence can be made more precise by using extra switches in order to make the switched-capacitor circuit parasitic-insensitive as shown in FIG. 1c. In this embodiment, the switched-capacitor circuit transfers pulses of charge that, over time, average to the same current flow I as follows. A switching cycle for the switched capacitor circuit includes a first phase in which a pair of switches S1 and S4 conduct while a pair of switches S2 and S3 are off. In a second phase, switches S2 and S3 conduct while switches S1 and S4 are off. As with the switched-capacitor circuit of FIG. 1b, the switching is performed in a non-overlapping fashion according to the switching frequency $f_{clk}$. The equivalent resistance of a switched-capacitor circuit thus depends on the clocking rate $f_{clk}$, or the capacitance $C_{clk}$. Adjusting either factor adjusts the equivalent resistance. FIG. 1d shows a switched-capacitor circuit in which the capacitance is made adjustable through the use a varactor as controlled by a control voltage $V_{CNTL}$. The switched-capacitor circuit may be exploited in a VCO as follows.

Voltage Controlled Oscillator (VCO)

Like a ring oscillator, a VCO also includes a plurality of VCO stages coupled together into a loop. However, the stages for a VCO have a variable resistance so that the frequency of oscillation may be voltage controlled. FIG. 2a shows a conventional inverter stage 200 using a differential pair of transistors $M_1$ and $M_2$ that steer a tail current through a current source transistor $M_3$ as controlled by a bias voltage $V_{BIAS}$. A pair of capacitors $C_L$ represent the parasitic capacitance between stage 200 and adjoining stages that form the VCO. A pair of variable resistors having a variable resistance $R_d$ (e.g., PMOS transistors in the triode mode of operation as controlled by a control voltage $V_{CTNL}$) control the signal delay between a pair of inverter input nodes having voltages $V_{in1}$ and $V_{in2}$ and a pair of inverter output nodes having voltages $V_{out1}$ and $V_{out2}$. It can be shown that the resulting frequency of operation ($f_{VCO}$) for a VCO incorporating a plurality of inverter stages 200 is proportional to $1/R_d C_L$. The conventional VCO oscillation frequency is thus dependent on process corner and temperature variations that affect $R_d$ and $C_l$.

In contrast, a VCO inverter stage 250 as shown in FIG. 2b obviates this frequency dependence on process corner variations by using variable switched-capacitor circuits 255 that vary their resistances responsive to a control voltage $V_{CNTL}$ such as discussed with regard to FIG. 1d. The VCO output frequency is as discussed with regard to inverter 200, namely $1/R_d C_L$. But the variable resistance $R_d$ for a switched-capacitor circuit is $1/f_{clk} C_{clk}$ as discussed above. It thus follows that the frequency of oscillation $f_{VCO}$ for a VCO using a plurality of stages 250 becomes $$f_{vco} \propto \frac{f_{clk} C_{clk}}{C_L}.$$

Figure 3:
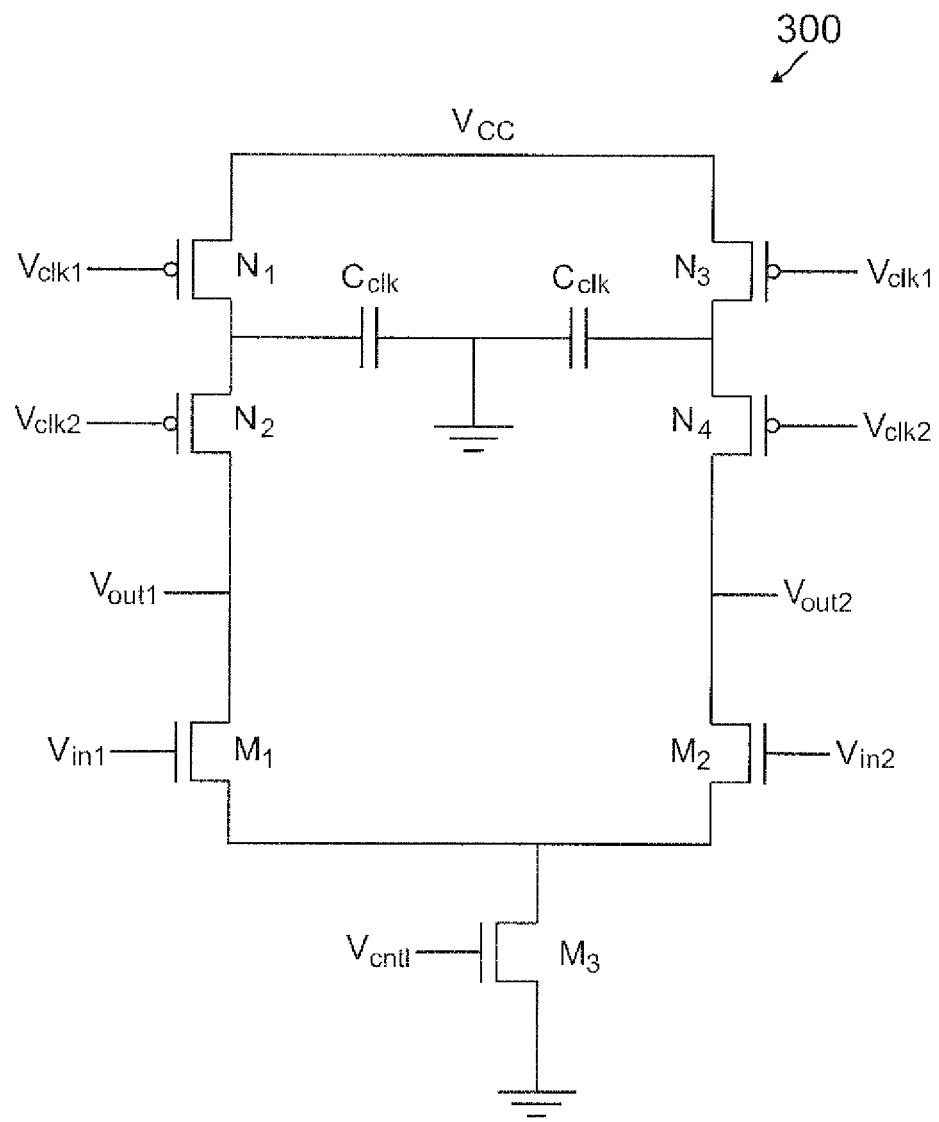
FIG. 3 is a schematic illustration of an embodiment for the inverter stage of FIG. 2 that is parasitic insensitive.

FIG. 3 illustrates a parasitic-insensitive embodiment 300 for inverter stage 255. In inverter 300, the switched-capacitor circuits are implemented using the parasitic-insensitive switched-capacitor circuits such as discussed with regard to FIG. 1c. Variable capacitors $C_{clk}$ may be implemented using varactors as discussed with regard to FIG. 1d. A first switched-capacitor circuit uses switches $N_1$ and $N_2$ whereas a second switched-capacitor circuit uses switches $N_3$ and $N_4$. $V_{clk1}$ and $V_{clk2}$ are non-overlapping clock signals that cycle according to the clock frequency $f_{clk}$.

Note the intrinsic self-compensation that is provided by inverters 250 and 300: whatever process corner (fast or slow) that is used to construct an inverter stage 250 or 300 will affect $C_{clk}$, and $C_L$ in substantially the same fashion. Thus, any semiconductor process variation effect on the resulting $f_{VCO}$ is inherently cancelled. Similarly, whatever temperature change effect that occurs to $C_{clk}$ will occur in substantially the same fashion for $C_L$. Thus, any temperature variation effect on $f_{VCO}$ is also inherently cancelled. In this fashion, both temperature compensation and semiconductor process variation compensation is achieved without the use of any compensation circuitry, thereby leading to manufacturing cost and design efficiencies. The requirements discussed above with regard to factors (i) and (ii) are thus satisfied.

Figure 4:
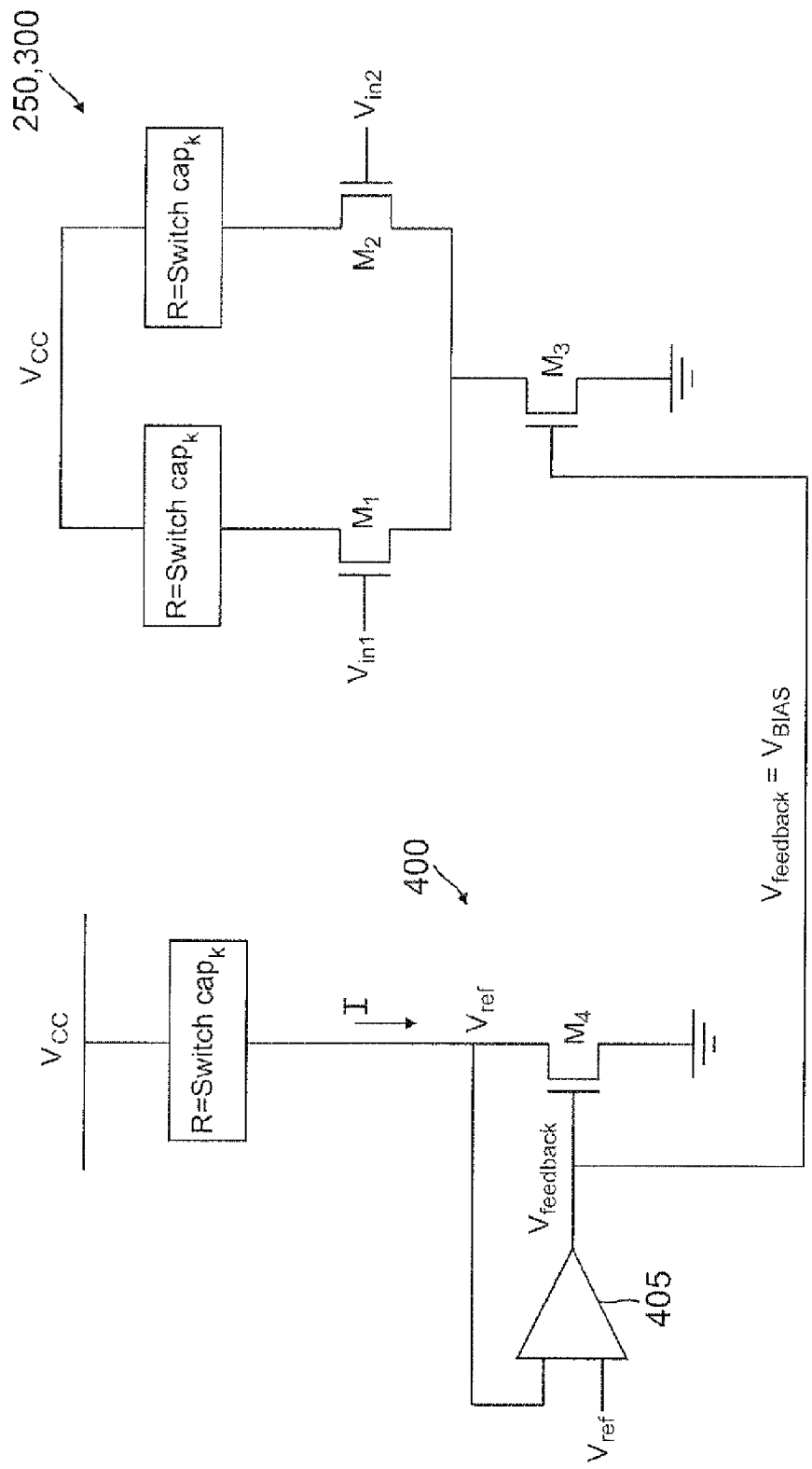
FIG. 4 is a schematic illustration of an inverter stage biased by a bias circuit so that the output frequency and amplitude of oscillation is independent of temperature and process corner variations and so that the amplitude of oscillation is independent of tuning range.

It remains to be shown how to achieve factors (iii) through (v) with regard to the VCO amplitude of oscillation. In that regard, one of the fundamental issues in voltage controlled oscillators is the significant variation of the output amplitude swing across the frequency tuning range. To eliminate this output amplitude swing, the bias voltage $V_{BIAS}$ for inverters 250 or 300 is provided by a bias circuit. FIG. 4 shows an example bias circuit 400 providing the bias voltage $V_{BIAS}$ for an inverter stage. Bias circuit 400 includes a FET $M_4$ that is matched to current source $M_3$ in the inverter stage. A differential amplifier drives the gate of $M_4$ with a feedback voltage $V_{feedback}$ generated in response to comparing a reference voltage $V_{ref}$ (such as generated by a bandgap reference circuit or other stable reference voltage generating circuit) to a drain voltage for $M_4$. Differential amplifier 405 will thus drive $V_{feedback}$ so as to make the drain voltage for $M_4$ virtually equal to $V_{ref}$. The drain of $M_4$ couples through a switch-capacitor circuit to a power supply node having a voltage $V_{CC}$. This feedback operation therefore ensures that $$V_{ref} = V_{cc} - IR = V_{cc} - \frac{I}{f_{clk} C_{clk}}.$$

where I is the current through $M_4$ and R is the resistance of the switched-capacitor circuit. Since $M_3$ and $M_4$ are matched and have the same gate voltage ($V_{feedback}$ being the same as $V_{BIAS}$), M+ also sources current I. During oscillation in the inverter stage, the tail current I will swing between transistors $M_1$ and $M_2$. In one extreme during an oscillation cycle, $M_1$ will conduct virtually all the current I whereas later in the same oscillation cycle, $M_2$ will conduct virtually all the current I. When either $M_1$ or $M_2$ is not conducting, its drain voltage will rise to $V_{CC}$. In contrast, if either of M1 or M2 is conducting all the tail current I, the drain voltage will fall to $V_{CC}$–IR, where R is the resistance for the switched-capacitor circuits. Thus the voltage at the drain of $M_1$ (and similarly $M_2$) varies between $V_{CC}$ and $$V_{cc} - \frac{I}{f_{clk} C_{clk}},$$

with the range of oscillation being $$\frac{I}{f_{clk} C_{clk}}.$$

It thus follows that the amplitude of oscillation ($A_{osc}$) of the resulting VCO is given by $$A_{osc} = \frac{I}{f_{clk} C_{clk}} = V_{cc} - V_{ref}.$$

Advantageously, as the tuning voltage changes for the inverter of FIG. 4, the amplitude of oscillation remains fixed at $V_{cc}$–$V_{ref}$. Furthermore, as the temperature and the process corners vary, the amplitude of oscillation also remains fixed at $V_{cc}$–$V_{ref}$. Thus, the inverter of FIG. 4 satisfies all five requirements (i) through (v) discussed above.

Figure 5:
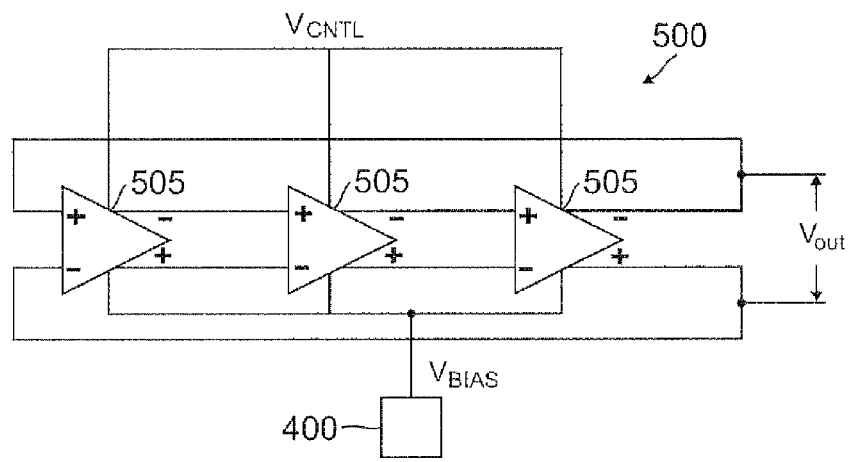
FIG. 5 illustrates a VCO incorporating a plurality of the inverter stages of FIG. 4.

FIG. 5 illustrates a VCO 500 incorporating a plurality of inverters 505 such as inverters 250 or 300 discussed above. Bias circuit 400 is shown separately as a single bias circuit may be common to all inverters 505 in lieu of repeating this circuit for each inverter. As the tuning voltage $V_{CNTL}$ is varied the frequency of oscillation $f_{VCO}$ for an output voltage $V_{out}$ is varied accordingly. However, this tuning does not affect the output amplitude as discussed above. Moreover, the amplitude of $V_{out}$ does not depend on temperature or process corner variations. Similarly, the output frequency $f_{VCO}$ is independent of process corner and temperature variations. In general, VCO 500 requires an odd number of inverters. However, an even number of inverters may be used if one is implemented in a non-inverting configuration to prevent latch-up.

Figure 6:
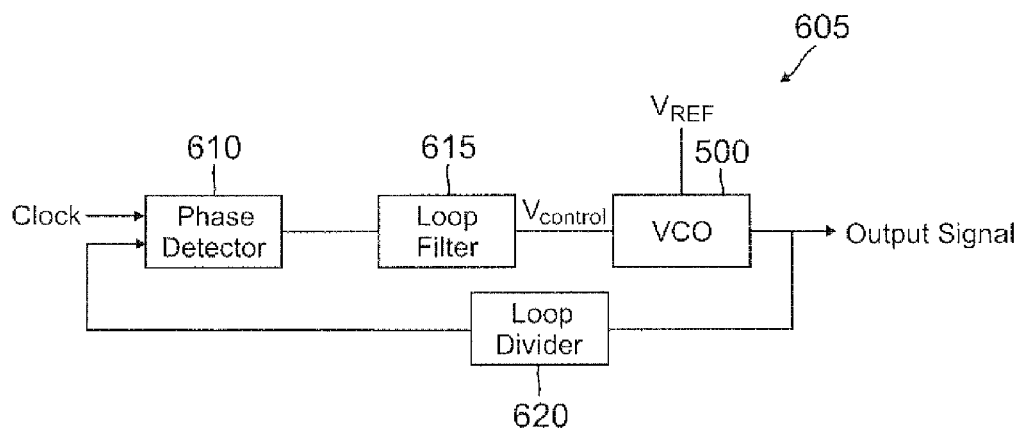
FIG. 6 illustrates a phase-locked loop (PLL) incorporating the VCO of FIG. 5.

The robust properties of VCO 500 have many advantageous applications. For example, a phase-locked loop (PLL) 605 is shown in FIG. 6 that incorporates VCO 500. PLL 605 also includes a phase detector 610, a loop filter 615, and a loop divider 620 to produce an output signal with regard to an input clock signal. This PLL output signal will satisfy requirements (i) through (v) discussed above.

It will be appreciated that the techniques and concepts discussed herein are not limited to the specific disclosed embodiments but instead may be changed or modified. The appended claims encompass all such changes and modifications as fall within the true spirit and scope of this invention.

I claim:

1. A voltage-controlled oscillator (VCO) having an output signal having a frequency responsive to a tuning signal, comprising:
   a plurality of inverters coupled to form a loop, each inverter having a differential pair of transistors configured to steer a tail current from a current source transistor, the current source transistor sourcing the tail current responsive to a bias voltage, each inverter stage including a plurality of switched-capacitor circuits configured to control a signal delay through the inverter stage in response to the tuning signal so as to control the frequency of the output signal; and
   a node to provide a power supply signal; and
   a bias circuit configured to generate the bias voltage responsive to the power supply signal, coupled from the node to the bias circuit via an additional switched-capacitor circuit, and a reference signal such that an amplitude of the output signal is substantially independent of the output signal frequency and depends upon the reference signal;
   wherein the amplitude of the output signal remains fixed at the difference between the power supply signal and the reference signal and is independent of the tuning signal.

2. The VCO of claim 1, wherein the bias circuit includes a differential amplifier configured to generate the bias voltage.

3. The VCO of claim 1, wherein the plurality of inverters comprises an odd number of inverters.

4. The VCO of claim 3, wherein the plurality of switched-capacitor circuits for each inverter is a pair of switched-capacitor circuits.

5. The VCO of claim 4, wherein a first switched-capacitor circuit in each switched-capacitor circuit pair for each inverter is configured to isolate a first transistor in the differential pair from the power supply node, and wherein a remaining second switched-capacitor circuit in each switched-capacitor circuit pair for each inverter is configured to isolate a remaining second transistor in the differential pair from the power supply node.

6. The VCO of claim 5, wherein each of the first and second switched capacitor circuits each comprises a pair of switches coupled in parallel with regard to a varactor having a variable capacitance controlled by the tuning signal.

7. The VCO of claim 2, wherein the bias circuit includes a first transistor matched to the current source transistor, wherein the differential amplifier drives a gate voltage for the first transistor with the bias voltage.

8. The VCO of claim 7, wherein the additional switched-capacitor circuit couples between the first transistor and the power supply node.

9. The VCO of claim 1, wherein the plurality of inverters comprises three inverters.

10. The VCO of claim 1, wherein the plurality of inverters comprises five inverters.

11. A phase-locked-loop (PLL), comprising:
   a phase detector configured to compare the phase between a divided signal and an input signal to provide a phase detector output signal;
   a loop filter configured to filter the phase detector output signal to provide a tuning signal; and
   a voltage-controlled oscillator (VCO) including a plurality of inverters coupled to form a loop, each inverter having a differential pair of transistors configured to steer a tail current from a current source transistor, the current source transistor sourcing the tail current responsive to a bias voltage, each inverter stage including a plurality of switched-capacitor circuits configured to control a signal delay through the inverter stage in response to the tuning signal so as to control the frequency of the output signal; a node to provide a power supply signal; and a bias circuit configured to generate the bias voltage responsive to the power supply signal, coupled from the node to the bias circuit via an additional switched-capacitor circuit, and a reference signal such that an amplitude of an output signal for the PLL is substantially independent of its output signal frequency and depends upon the reference signal;

wherein the amplitude of the output signal for the PLL remains fixed at the difference between the power supply signal and the reference signal and is independent of the tuning signal.

12. The PLL of claim 11, wherein the bias circuit includes a differential amplifier configured to generate the bias voltage.

13. The PLL of claim 11, wherein the plurality of inverters comprises an odd number of inverters.

14. The PLL of claim 13, wherein the plurality of switched-capacitor circuits for each inverter is a pair of switched-capacitor circuits.

15. The PLL of claim 14, wherein a first switched-capacitor circuit in each switched-capacitor circuit pair for each inverter is configured to isolate a first transistor in the differential pair from the power supply node, and wherein a remaining second switched-capacitor circuit in each switched-capacitor circuit pair for each inverter is configured to isolate a remaining second transistor in the differential pair from the power supply node.

16. The PLL of claim 15, wherein each of the first and second switched capacitor circuits each comprises a pair of switches coupled in parallel with regard to a varactor having a variable capacitance controlled by the tuning signal.

17. The PLL of claim 12, wherein the bias circuit includes a first transistor matched to the current source transistor, wherein the differential amplifier drives a gate voltage for the first transistor with the bias voltage.

18. The PLL of claim 17, wherein the additional switched-capacitor circuit couples between the first transistor and the power supply node.

19. The PLL of claim 11, wherein the plurality of inverters comprises three inverters.

20. The PLL of claim 11, wherein the plurality of inverters comprises five inverters.

* * * * *